United States Patent
O'Shea et al.

(10) Patent No.: US 7,525,183 B2
(45) Date of Patent: Apr. 28, 2009

(54) SURFACE MOUNT MULTICHIP DEVICES

(75) Inventors: Paddy O'Shea, Inchigeelagh (IE); Eamonn Medley, Thurles (IE); Finbarr O'Donoghue, Aherla (IE); Gary Horsman, Woodstock, VT (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 11/825,991

(22) Filed: Jul. 10, 2007

(65) Prior Publication Data

US 2008/0017959 A1    Jan. 24, 2008

Related U.S. Application Data

(60) Continuation of application No. 11/183,504, filed on Jul. 18, 2005, now Pat. No. 7,242,078, which is a division of application No. 10/617,343, filed on Jul. 10, 2003, now Pat. No. 6,919,625.

(51) Int. Cl.
*H01L 23/495* (2006.01)
(52) U.S. Cl. .............. 257/676; 257/E23.031; 257/E23.034; 257/E23.044; 257/E23.047; 257/E23.052; 257/666; 257/677; 257/685; 257/723; 257/686; 257/675; 257/916; 257/690; 257/691; 257/660; 361/119; 361/820; 361/56; 361/704

(58) Field of Classification Search ............... 257/676, 257/E23.031, E23.034, E23.044, E23.047, 257/E23.052, 677, 685, 686, 723, 777, 666, 257/916, 660, 497, 713, 706, 694, 675, 966, 257/690, 691, 692, 724, 693, 725; 361/119, 361/91, 56, 704, 820; 174/52.4
See application file for complete search history.

(56) References Cited

U.S. PATENT DOCUMENTS

| | | | |
|---|---|---|---|
| 4,794,431 A | 12/1988 | Park | 257/82 |
| 4,807,021 A * | 2/1989 | Okumura | 257/777 |
| 5,084,753 A | 1/1992 | Goida et al. | 357/70 |
| 5,150,271 A | 9/1992 | Unterweger et al. | 361/119 |
| 5,252,632 A | 10/1993 | Savin | 523/137 |

(Continued)

OTHER PUBLICATIONS

O'Shea, Paddy, "TransZorg, TVSSelection—Unidirectional vs. Bidirectional," http://www.gensemi.com/appnotespdf/TVSSelection-UnivsBi.pdf.

(Continued)

*Primary Examiner*—Alexander O Williams
(74) *Attorney, Agent, or Firm*—Mayer & Williams PC; Stuart H. Mayer, Esq.; Karin L. Williams, Esq.

(57) ABSTRACT

A surface mountable multi-chip device is provided which includes first and second lead frames portions and at least two chips. The lead frame portions each include a header region and a lead region. Beneficially, the header regions of the first and second lead frame portions lie in a common plane, with at least one semiconductor chip being placed on each of the header regions. A conductive member link is placed on top of the two chips to electrically and mechanically interconnect the chips.

2 Claims, 7 Drawing Sheets

U.S. PATENT DOCUMENTS

| | | | |
|---|---|---|---|
| 5,306,949 A | 4/1994 | Yamada et al. | 257/690 |
| 5,337,216 A | 8/1994 | McIver | 361/728 |
| 5,404,044 A * | 4/1995 | Booth et al. | 257/698 |
| 5,484,097 A | 1/1996 | Heuvel | 228/123.1 |
| 5,489,800 A | 2/1996 | Brown et al. | 257/666 |
| 5,506,174 A | 4/1996 | Vandenheuvel et al. | 437/209 |
| 6,054,754 A | 4/2000 | Bissey | 257/666 |
| 6,133,632 A | 10/2000 | Davis et al. | 257/723 |
| 6,184,574 B1 | 2/2001 | Bissey | 257/666 |
| 6,291,880 B1 | 9/2001 | Ogawa et al. | 257/723 |
| 6,307,755 B1 | 10/2001 | Williams et al. | 361/813 |
| 6,633,080 B2 | 10/2003 | Hamachi | 257/730 |
| 6,774,466 B1 | 8/2004 | Kajiwara et al. | 257/673 |
| 6,800,932 B2 | 10/2004 | Lam et al. | 257/706 |
| 6,815,830 B2 * | 11/2004 | Miyasaka | 257/778 |
| 7,071,523 B2 | 7/2006 | Yano et al. | 257/433 |
| 2002/0109211 A1 | 8/2002 | Shinihara | 257/666 |
| 2002/0149314 A1 | 10/2002 | Takahashi et al. | 313/500 |
| 2003/0234444 A1 | 12/2003 | Smith et al. | 257/690 |
| 2004/0000702 A1 | 1/2004 | Knapp et al. | 257/666 |
| 2004/0082109 A1 | 4/2004 | Tanaka | 438/112 |
| 2004/0113247 A1 | 6/2004 | Planey | 257/678 |
| 2004/0147061 A1 | 7/2004 | Pavier et al. | 438/106 |
| 2004/0201081 A1 | 10/2004 | Joshi et al. | 257/666 |
| 2004/0207052 A1 | 10/2004 | Joshi et al. | 257/666 |
| 2004/0217474 A1 | 11/2004 | Kajiwara et al. | 257/734 |
| 2005/0073018 A1 | 4/2005 | Yano et al. | 257/433 |
| 2005/0224945 A1 | 10/2005 | Saito et al. | 257/686 |

OTHER PUBLICATIONS

Vishay Semiconductors. Surface MountTransZorb Transient Voltage Suppressors. DO-215AA (SMBG). Document No. 88456. Sep. 26, 2002. http://www.vishay.com.

Vishay Semiconductors. Surface MountTransZorb Transient Voltage Suppressors. DO-241AA (SMB J-Bend). Document No. 88392. Sep. 26, 2002. http://www.vishay.com.

* cited by examiner

SURFACE MOUNT MULTICHIP DEVICES

STATEMENT OF RELATED APPLICATIONS

This application is a continuation of U.S. patent application Ser. No. 11/183,504, filed Jul. 18, 2005, entitled "Surface Mount Multichip Devices", now U.S. Pat. No. 7,242,078, which is a divisional of U.S. patent application Ser. No. 10/617,343, filed Jul. 10, 2003, entitled "Surface Mount Multichip Devices," now U.S. Pat. No. 6,919,625. Each of the prior applications is incorporated herein by reference in its entirety.

FIELD OF THE INVENTION

The present invention relates to two-lead, surface-mount multichip devices. The invention has utility, for example, in the fabrication of high-voltage diodes and low-capacitance, high-power, transient voltage suppressor (TVS) devices.

BACKGROUND OF THE INVENTION

FIG. 1 is a schematic, cross sectional view of a known surface-mount structure, which contains a diode chip 10. Diode chip 10 is disposed within a package 40, the outline of which is illustrated. The structure contains an upper lead frame 20, a lower lead frame 21. Lead flames, conductive frames containing leads and headers to which an unpackaged die (or "chip") can be attached, are well known in the semiconductor industry. The lead frames 20, 21 have header regions 20A, 21A (also known as "chip pads" or "die pads"), which are in electrical contact with diode 10 and which are commonly provided with dimples (not shown) to enhance electrical contact. The lead frames 20, 21 also have lead regions 20B, 21B that extend beyond the packaging 40. By wrapping the lead regions 20B, 21B around the underside of the packaging 40 (into a so-called "J-bend" configuration) or by bending lead regions 20B, 21B downward and outward (into a so-called "gull wing" configuration), the structure can be readily surface mounted on another structure such as a circuit board.

Surface-mount devices having thin packaging are desirable in a number of applications, for example, in circuit boards for laptop computers, where vertical space is at a premium. The present invention addresses these and other needs by providing a multichip surface-mount device, while at the same time avoiding the need stack chips upon one another within the device.

SUMMARY OF THE INVENTION

According to a first aspect of the present invention, a surface-mountable device is provided which comprises: (a) a first chip comprising lower and upper electrical contacts; (b) a second chip comprising lower and upper electrical contacts; (c) a first lead frame portion comprising a header region and a lead region, in which the lower contact of the first chip is in electrical and mechanical connection with the header region of the first lead frame portion; (d) a second lead frame portion comprising a header region and a lead region, in which the lower contact of the second chip is in electrical and mechanical connection with the header region of the second lead frame portion; (e) a conductive member (or members) disposed between and in electrical and mechanical connection with the upper electrical contact of the first chip and the upper electrical contact of the second chip; and (f) packaging material, which encapsulates at least a portion of each of the following: the first and second chips, the header regions of the first and second lead frame portions, and the conductive member. Typically, the lower and upper electrical contacts are on opposing surfaces of the first and second chips.

The lead regions of the first and second lead frame portions extend from the packaging material and are adapted to allow the device to be surface-mounted with another electrical component. The first and second chips are not stacked upon each other within the packaged device.

The surface-mountable device can be, for example, a TVS device, for instance, a low-capacitance and/or high-voltage TVS device. In some embodiments, the first and second chips correspond to diodes, for example, rectifier diodes and/or avalanche breakdown diodes. As a specific example, the first chip can correspond to an avalanche breakdown diode and the second chip can correspond to a rectifier diode having a lower capacitance than the avalanche breakdown diode. In other embodiments, the first chip can correspond to a thyristor surge suppressor and the second chip can correspond to a rectifier diode having a lower capacitance than the thyristor surge suppressor.

Exemplary conductive members for the surface-mountable device include wires and generally planar members (which can be provided with dimples for improved electrical contact, if desired). In some embodiments, a plurality of conductive members (e.g., wire bonds) are disposed between, and in electrical and mechanical connection with, the upper electrical contact of the first chip and the upper electrical contact of the second chip.

Typically, the header regions of the first and second lead frame portions do not overlap one another within the device, and are more typically coplanar within the device.

In many embodiments, the first and second lead frame portions will each comprise one or more detachment regions, which correspond to locations of separation from a precursor lead frame.

According to another aspect of the present invention, a method of manufacturing the above surface-mountable device is provided. The method comprises: (a) providing a precursor lead frame comprising the first lead frame portion, the second lead frame portion, and a severable portion; (b) placing the lower contact of the first chip in electrical and mechanical connection with the header region of the first lead frame portion, (c) placing the lower contact of the second chip in electrical and mechanical connection with the header region of the second lead frame portion; (d) placing the conductive member or members in electrical and mechanical connection with the upper electrical contact of the first chip and the upper electrical contact of the second chip; (e) encapsulating at least a portion of the first and second chips, the header regions of the first and second lead frame portions, and the conductive member in the packaging material; and (e) separating the first and second lead frame portions from the severable portion of the precursor lead frame.

In another embodiment, the above surface-mountable device further comprises a third chip having lower and upper electrical contacts, in which the lower contact of the third chip is in electrical and mechanical connection with the header region of the second lead frame portion, and the upper contact of the third chip is in electrical and mechanical connection with the conductive member (or members). As above, the lower and upper electrical contacts are typically on opposing surfaces of the first, second and third chips.

The surface-mountable device can be, for example, a TVS device (e.g., a low-capacitance and/or high-voltage TVS device). In some embodiments, the first chip corresponds to a bidirectional avalanche breakdown diode and the second and third chips correspond to rectifier diodes (e.g., one rectifier with cathode side up and the other rectifier with cathode side down—an arrangement referred to in the art as "antiparallel"), each of which has a lower capacitance than the bidirectional avalanche breakdown diode.

In other embodiments, the first chip corresponds to a bidirectional thyristor surge suppressor, and the second and third chips correspond to rectifier diodes (disposed, for example, in antiparallel with one another), each of which has a lower capacitance than the bidirectional thyristor surge suppressor.

In other embodiments, the second and third chips can be replaced by a single chip having two active areas. (e.g., one active area with a cathode on the upper surface and an anode on the lower surface, and another active area with an anode of the upper surface and a cathode on the lower surface—i.e., in an antiparallel arrangement).

In some embodiments, a plurality of conductive members are provided, which are disposed between and in electrical and mechanical connection with the upper electrical contact of the first chip, the upper electrical contact of the second chip, and the upper electrical contact of the third chip, in a fashion such that the upper electrical contacts of the first, second and third chips are shorted together.

In another embodiment of the invention, the above surface-mountable device includes two or more chips in electrical and mechanical connection with the header region of the first lead frame portion and two or more chips in electrical and mechanical connection with the header region of the second lead frame portion, with the conductive member (or members) in electrical and mechanical connection with each chip.

As is typical, "upper" and "lower," etc., as these terms relate to direction, are merely indicative of relative direction and do not necessarily correlate, for example, with the direction of the force exerted by the earth's gravitational field.

An advantage of the present invention is that a surface-mount, multi-chip devices can be provided without stacking chips. By eliminating the need to stack chips, the present invention can provide thinner packaging, which proves invaluable in numerous applications, for example, laptop computers as discussed above.

Other advantages of the present invention are that (a) a surface-mount, multi-chip device can be constructed which contains chips in series, and if desired, in parallel (e.g., antiparallel) and (b) a surface-mount, multi-chip device can be constructed which contains chips of varying sizes. These features are not presently available with stacked chip designs.

Another advantage of the present invention is that a surface-mount, multi-chip device can be provided that has lower thermal resistance relative to an equivalent stacked chip structure, improving the power handling capability of the device.

Yet another advantage of the present invention is that a two-lead, multi-chip, low-capacitance, high-power, bidirectional TVS device (for example, either an avalanche-type or a thyristor-type TVS device) can be provided.

These and other embodiments and advantages of the present invention will become immediately apparent to those of ordinary skill in the art upon review of the Detailed Description and claims to follow.

DETAILED DESCRIPTION OF THE INVENTION

The present invention now will be described more fully hereinafter with reference to the accompanying drawings, in which preferred embodiments of the present invention are shown. This invention may, however, be embodied in different forms and should not be construed as limited to the embodiments set forth herein.

Figure 1:
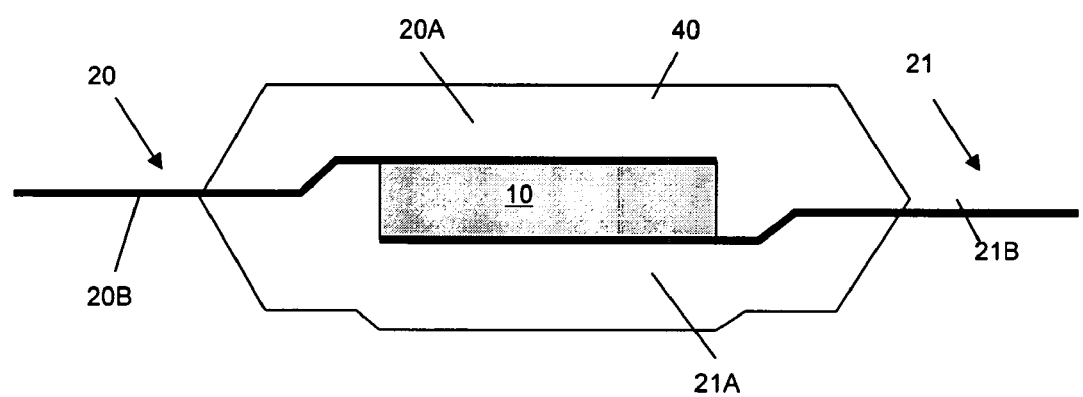
FIG. 1 is a schematic, cross sectional view of a known two-lead, surface-mount device.
Figure 2A:
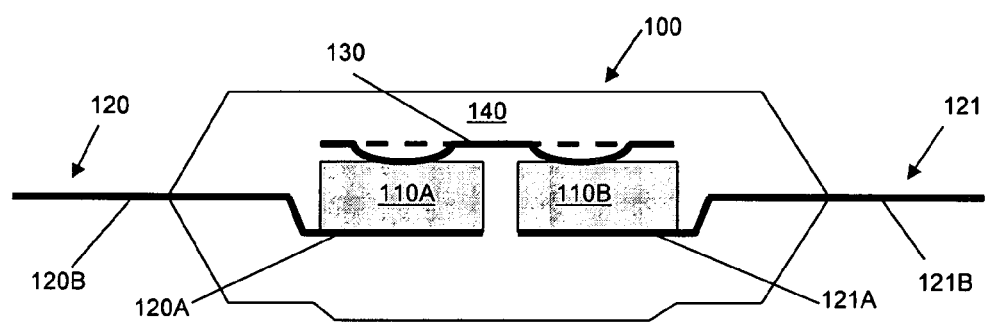
FIG. 2A is a schematic, cross sectional view of a two-lead, surface-mount, multichip device in accordance with an embodiment of the present invention.

One embodiment of a multi-chip structure in accordance with the present invention is schematically shown in the cross sectional view of FIG. 2A. As illustrated, a first chip 110A is placed on a header region 120A (also referred to in the art as a "die pad" or chip pad") of a first lead frame portion 210, and a second chip 110B is placed on a header region 121A of a second lead frame portion 121.

In the embodiment shown, the header regions 120A, 121A of the first and second lead frame portions 120, 121 are substantially coplanar with one another within the device. The gap between the first and second lead frame portions 120, 121 should be sufficiently large to prevent arcing between one another. On the other hand, the gap is typically kept as small as is practically possible to minimize the width of the device. One way to ensure that the first and second lead frame portions 120, 121 are coplanar with one another and to maintain a proper gap size is to initially provide the first and second lead frame portions 120, 121 within a single precursor lead frame, and subsequently separate them during the production process, typically after molding. This feature of the present invention is discussed in more detail below.

The packaged structure 100 of FIG. 2A is further provided with a conductive member, which provides electrical connection between the first and second chips 110A, 110B. In the embodiment illustrated, the conductive member is a dimpled link member 130, which is placed into a position overlying and contacting an upper surface of each chip 110A, 110B so as to mechanically and electrically connect the chips in series. The link 130, optionally dimpled, can be, for example, picked and placed as is known in the art.

Dimples are provided in the link 130 of the embodiment illustrated in FIG. 2A to avoid contact with the passivation that is present on the chips 110A, 110B. For devices having passivation on both sides, it would be desirable to provide dimples on both the link and on the header region of the lead frame portion. Of course, in other embodiments, such as those using wire bonds, there is no need for dimples.

Although a substantially planar, dimpled link 130 is illustrated, other conductive members, for example, nonplanar conductive sheets (a "sheet" is defined herein as being an object whose thickness is significantly less than its length and width) or wires, can also be used to electrically connect chip 110A with chip 110B.

The completed structure includes a housing 140, which completely encapsulates the chips 110A, 110B. The header regions 120A, 121A of the lead frame portions 120, 121 are also encapsulated. The lead regions 120B, 121B, on the other hand, extend laterally outwardly from the device housing 140 to allow electrical connection to the device. In the embodiment illustrated, the lead regions 120B, 121B extend in opposite directions from the device in a common plane, but this is by no means necessary.

Figure 2B:
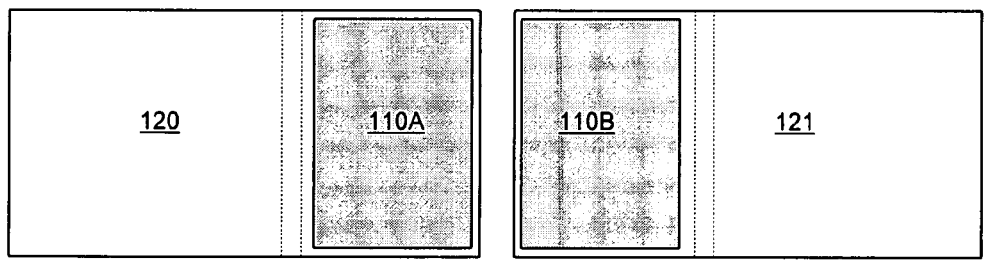
FIG. 2B is a schematic, partial plan view of the device of FIG. 2A illustrating the chips and lead frame portions of the device.
Figure 2C:
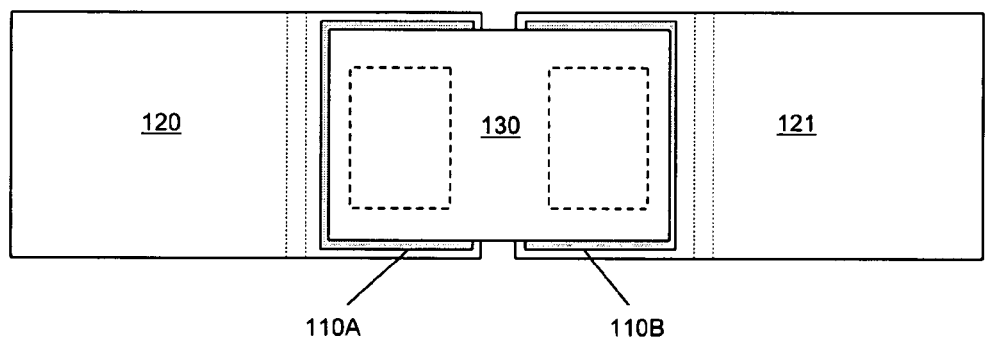
FIG. 2C is a schematic, partial plan view of the device of FIG. 2A illustrating the conductive link, chips and lead frame portions of the device.

FIG. 2B is a schematic partial plan view of the structure of FIG. 2A in which only the first and second chips 110A, 110B and the lead frame portions 120, 121 are illustrated. In the particular design illustrated, rectangular chips 110A, 110B are utilized to increase the surface area, and consequently the power handing of the packaged structure. The dashed lines in FIG. 2B correspond to the bends in the lead frame portions 120, 121, which can be clearly seen in FIG. 2A. FIG. 2C is like FIG. 2B, except that FIG. 2C further illustrates the position of the link 130 relative to the chips 110A, 110B. The dashed lines on the link 130 correspond to the dimples previously discussed.

Although not illustrated below in FIGS. 3A-B, 4, 5A-C, 6, 7 and 8, dimples can clearly be provided in connection with these embodiments where desired.

Figure 3A:
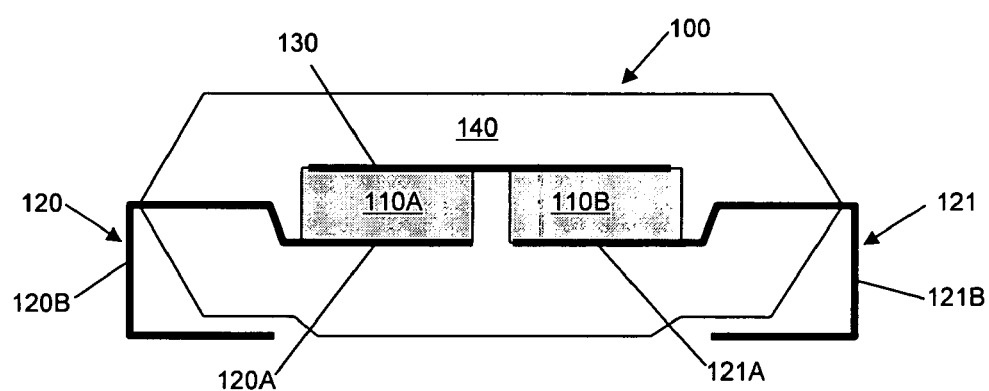
FIGS. 3A, 3B and 4 are schematic, cross sectional views of two-lead, surface-mount, multichip devices in accordance with other embodiments of the present invention.
Figure 3B:
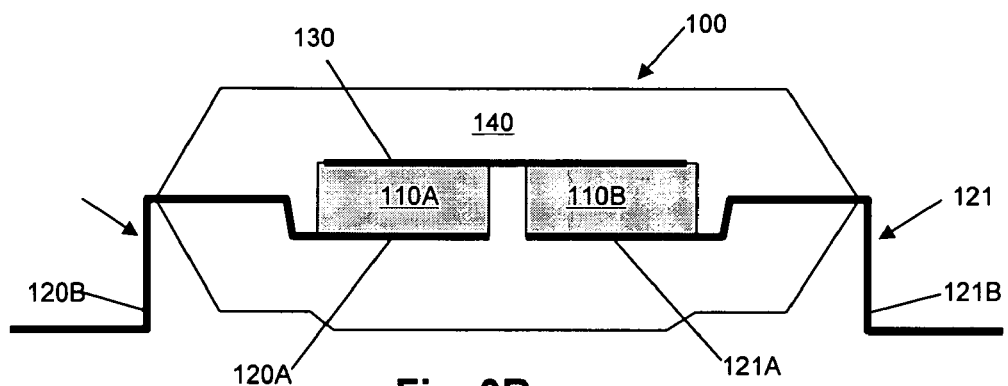
Figure 4:
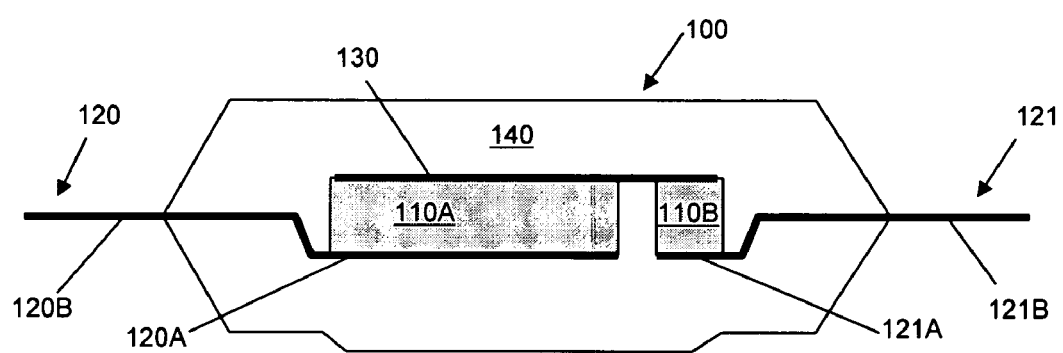

Numerous configurations are available by which the structure 100 illustrated in FIG. 2A can be converted into a surface mount structure. For example, FIG. 3A illustrates a configuration wherein the lead regions 120B, 121B of the lead frame portions 120, 121 are bent around the housing 140 in a "J-bend" configuration. Another configuration is illustrated in FIG. 3B, in which the lead regions 120B, 121B of the lead frame portions 120, 121 are bent downward and outward in a "gull wing" configuration.

A package structure like that illustrated in FIG. 2A can accommodate a number of different types of chips 110A, 110B. As one example, chips 110A and 110B can correspond to two diodes, for example, a pair of rectifier diodes or a pair of avalanche breakdown diodes (which may be either unidirectional or bidirectional). By placing two diodes in series within the structure (i.e., one diode anode side up, and the other diode cathode side up), the reverse voltage range of the diodes can be extended (i.e., doubled).

As another example, a low-capacitance unidirectional transient voltage suppressor (TVS) device can be constructed by having chip 110A correspond to a high-capacitance unidirectional avalanche breakdown diode and chip 110B correspond to a low-capacitance rectifier diode having a higher breakdown voltage than the avalanche breakdown diode. In this embodiment, the two diodes are oppositely biased (i.e., that are connected in either a cathode-to-cathode or an anode-to-anode configuration). Because the low capacitance rectifier diode is in series with the high capacitance avalanche breakdown diode, the net capacitance is $C_{net}=(C_{AD} \times C_{RD})/(C_{AD}+C_{RD})$, where $C_{AD}$ is the capacitance of the unidirectional avalanche breakdown diode and $C_{RD}$ is the capacitance of the rectifier diode. By examining this equation, it can be seen that where $C_{AD}$ is much greater than $C_{RD}$, the net capacitance of the device is approximately equal to $C_{RD}$ (i.e., $C_{net} \approx C_{RD}$ where $C_{AD} >> C_{RD}$). For this reason, the TVS devices of the present invention are routinely low-capacitance devices.

The peak surge current, I, which a device can handle is the power rating, P, divided by the voltage, V (i.e., I=P/V). For example, a 600 W avalanche breakdown diode with a clamping voltage of 100V can handle a peak surge current of 6 Amps (note that avalanche-type TVS diodes are used in reverse bias). Because the rectifier diode is forward biased, one can reasonably assume that the forward voltage would be about 1V at 6 Amps. Therefore, the rectifier diode in this example only requires a forward power rating of about 6 W to handle the same surge current as a 600 W, 100V avalanche breakdown diode.

The power rating is generally proportional to the chip size (i.e., the larger the chip, the lower the thermal resistance and the higher the power rating). Hence, the rectifier diode can be much smaller than the avalanche-type diode in many embodiments. (Note, however, if it is desired for the rectifier to be the same size as the TVS, then it will still significantly reduce the capacitance, because the reverse breakdown voltage is inversely proportional to the capacitance.) To accommodate this difference in chip size, the header 120A of lead frame portion 120 can be made asymmetric relative to the header 121A of lead frame portion 121 (see, for example, FIG. 4). In this way, the size of the avalanche breakdown diode chip 110A that can be fitted within the packaged device is increased and the power handling maximized.

Although the functionality of the above-described structure can also be achieved by stacking an avalanche breakdown diode chip and a rectifier diode chip, this would require a thicker package, which is against a trend in the semiconductor industry in the direction of thinner devices. Also, the stacking approach results in higher thermal resistance, which limits the power handling capability of the device. Furthermore, it would be very difficult to align a smaller size rectifier diode chip with a larger size avalanche breakdown diode chip in a stacked, surface mount package, because the smaller chip would shift position while soldering.

Another example of a low-capacitance TVS device can be constructed by having chip 110A correspond to a high-capacitance unidirectional thyristor surge suppressor and chip 110B, correspond to a low-capacitance rectifier diode that has a higher breakdown voltage than the thyristor surge suppressor.

In this connection, it is noted that a thyristor surge suppressor displays what is commonly known as a "crowbar effect" (and hence this type of TVS is commonly referred to as a "crowbar-type TVS"). By this it is meant that once the device clamps the high voltage surge at its breakover voltage ($V_{BO}$) and breakover current ($I_{BO}$), it switches to a low-voltage (i.e., typically <10V), low-impedance state (i.e., the on-state). Since $I_{BO}$ is in the mA range, the device only needs to handle high currents at low voltages. This allows a thyristor surge suppressor to handle much more current than an avalanche breakdown diode with the same power rating. Consequently, the rectifier diode is generally relatively close in size to the thyristor surge suppressor to handle the surge current (but can be smaller if desired). However, because the rectifier diode has a reverse breakdown voltage that is typically substantially higher than that of the thyristor surge suppressor, its capacitance is lower, and the net capacitance of the device is reduced.

The above TVS devices are surface mount, low-capacitance, high-power devices. These characteristics make them beneficial for a number of applications. For example, these devices are useful in protecting high-speed data lines from power surges, because their low capacitance and leakage currents render them essentially transparent to the circuits that they are designed to protect during normal operation.

It is noted that FIGS. 2A-4 illustrate packaged structures 100 in which (a) one chip 110A on the first lead frame portion 120 is placed in series with (b) one chip 110B on the second lead frame portion 121. More broadly, however, the packaged structure of the present invention allows the series connection of 1, 2, 3 or more chips on the first lead frame portion with 1, 2, 3 or more chips on the second lead frame portion. Where multiple chips are placed on a single lead frame portion, they are electrically in parallel (e.g., antiparallel) with one another.

Figure 5A:
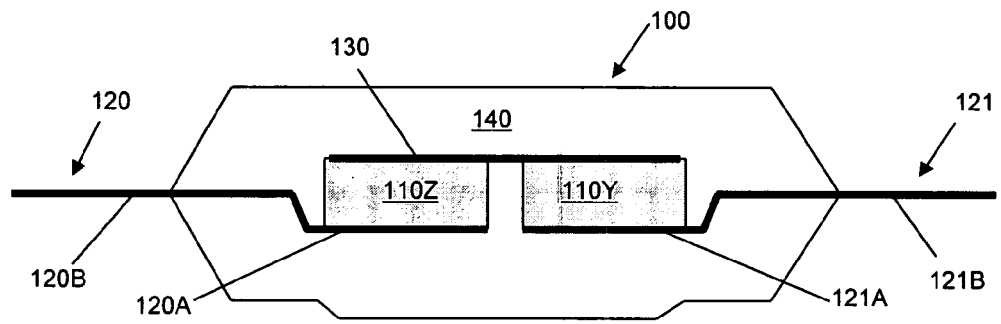
FIG. 5A is a schematic, cross sectional view of a two-lead, surface-mount, multichip device in accordance with an embodiment of the present invention.
Figure 5B:
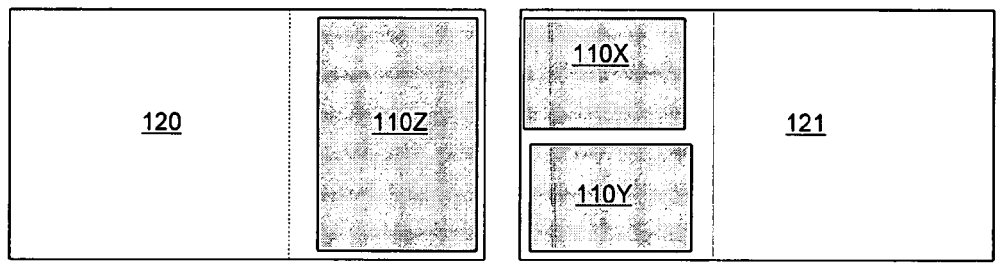
FIG. 5B is a schematic, partial plan view of the device of FIG. 5A illustrating the chips and lead frame portions of the device.
Figure 5C:
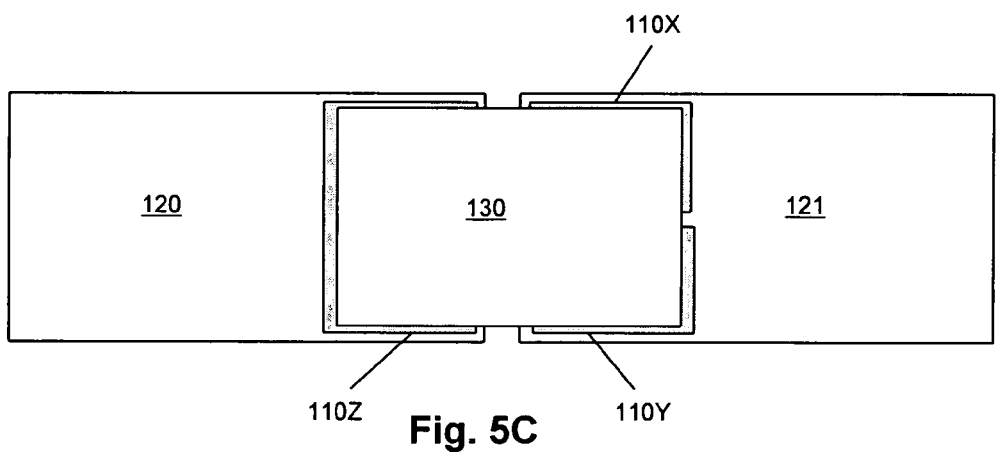
FIG. 5C is a schematic, partial plan view of the device of FIG. 5A illustrating the conductive link, chips and lead frame portions of the device.

For example, FIGS. 5A-5C illustrate a packaged structure 100 in which (a) one chip 110Z on first lead frame portion 120 is placed in series with (b) two chips 110X, 110Y, which are in antiparallel with each other, on second lead frame portion 121. (As discussed above, the two chips 110X, 110Y can be replaced in some embodiments by a single chip having two active regions.}

More specifically, the device illustrated in FIGS. 5A-5C is similar to the device of FIGS. 2A-2C in that it includes: a first lead frame portion 120 having a header region 120A and a lead region 120B; a second lead frame portion 121 having a header region 121A and a lead region 121B; a link 130; and a package 140. However, the device of FIGS. 2A-2C only contains first and second chips 110A, 110B in series with one another, while the device of FIGS. 5A-5C contains first and second chips 110X, 110Y, which are electrically in parallel (e.g., antiparallel) with one another, and which are further in series with third chip 110Z.

Figure 6:
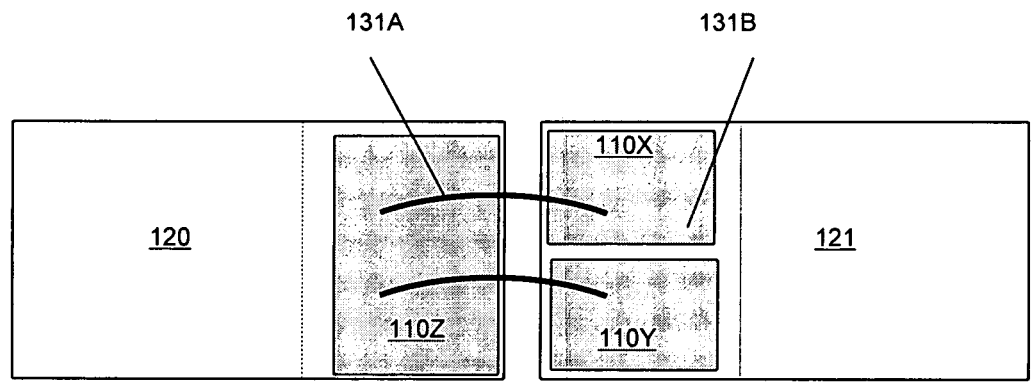
FIG. 6 is a schematic, partial plan view illustrating the conductive links, chips and lead frame portions of a two-lead, multichip device in accordance with an embodiment of the present invention.
Figure 7:
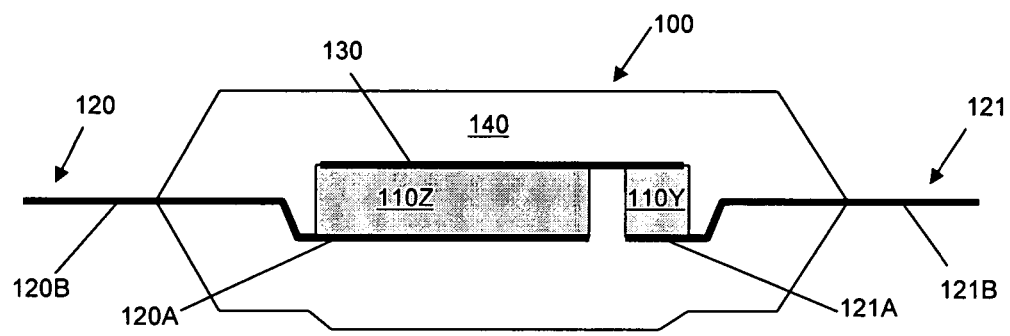
FIG. 7 is a schematic, cross sectional view of a two-lead, surface-mount, multichip device in accordance with an embodiment of the present invention.

As in FIG. 2C, a dimpled link 130 can be used to interconnect the chips 110X, 110Y and 110Z in FIG. 5C. However, a variety of connection schemes can also be used. For example, wire bonds 131A, 131B can be used to short the chips 110X, 110Y and 110Z together as illustrated in FIG. 6.

The structure of FIGS. 5A-5C can accommodate a number of different types of chips 110X, 110Y, 110Z. For example, a two-lead, low-capacitance, bidirectional transient voltage suppressor device can be constructed by having chip 110Z correspond to a high capacitance bidirectional avalanche breakdown diode, and by having chips 110X and 110Y correspond to two oppositely biased low-capacitance rectifier diodes, where each of the rectifier diodes has a higher breakdown voltage than that of the avalanche breakdown diode under appropriate bias.

As above, because the low capacitance rectifier diodes are in series with the high capacitance avalanche breakdown diode, the net capacitance of the device is low. Moreover, because one of the rectifier diodes will be forward biased during breakdown of the avalanche breakdown diode, the power rating of the rectifier diodes can be much lower that that of the avalanche breakdown diode, particularly at higher voltage ratings. Hence, the rectifier diodes can be much smaller than the avalanche breakdown diode in many embodiments, in which case the first and second lead frame portions may be asymmetric relative to each other (see, e.g., FIG. 7). By making the first and second lead frame portions asymmetric, the size of the avalanche breakdown diode chip 110Z that will fit within the packaged device is increased.

Another two-lead, low-capacitance, bidirectional transient voltage suppressor device can be constructed, for example, by having chip 110Z correspond to a high-capacitance, bidirectional thyristor surge suppressor, and by having chips 110X and 110Y correspond to two oppositely biased low-capacitance rectifier diodes. Each of the rectifier diodes has a higher breakdown voltage than that of the bidirectional thyristor surge suppressor under appropriate bias. As above, because the lower capacitance rectifier diodes are in series with the higher capacitance avalanche breakdown diode, the net capacitance of the device is lowered.

Low-capacitance, two-leaded, bidirectional TVS devices of either the avalanche or thyristor variety are not presently available in either axial or surface mount packages, likely due to the fact that it would be difficult, if not impossible, to duplicate the functionality of the structure illustrated in FIGS. 5A-5C by stacking chips in either in an axial package or surface-mount package.

Figure 8:
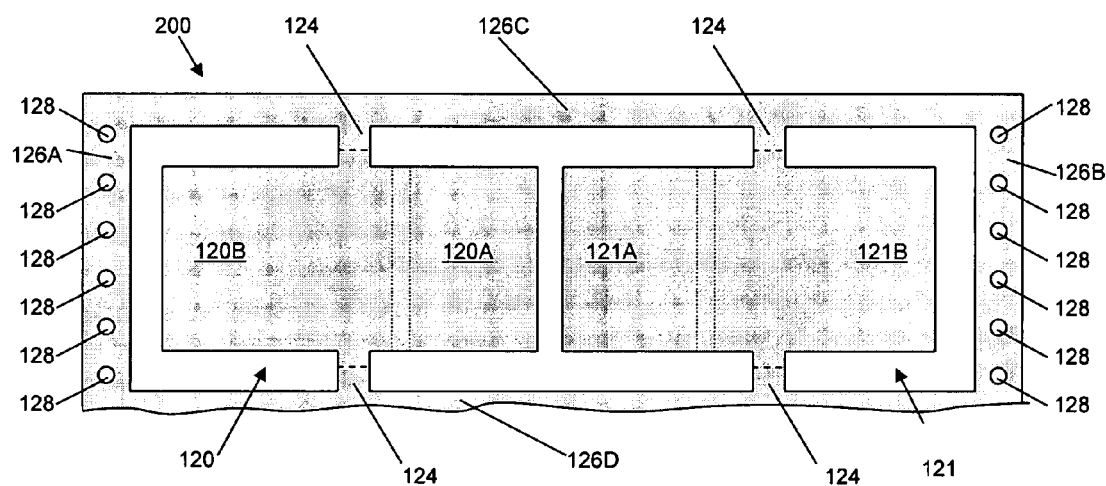
FIG. 8 is a schematic, plan view a precursor lead frame in accordance with an embodiment of the present invention.

Turning now to another aspect of the present invention, the first and second lead frame portions 120, 121 in the above figures can be provided within a single precursor lead frame at early stages of the manufacturing process if desired. A partial plan view of one example of such a precursor lead frame 200 is illustrated in FIG. 8. The precursor lead frame 200 typically comprises a patterned sheet of metal, e.g., copper. The precursor lead frame 200 can be formed using known processes, for example, by stamping processes or by photolithographic processes.

The precursor lead frame 200 includes a rail assembly comprised of side rails 126A, 126B, a top rail 126C, and a bottom rail 126D (only partially shown). The first and second lead frame portions 120, 121 (which include header regions 120A, 121A and lead regions 120B, 121B) are connected to the top and bottom rails 126C, 126D of the rail assembly via connection members 124. It is noted that the first and second lead frame portions 120, 121 are held in the same plane and in precise alignment with each another by connection members 124.

The left and right side rails 126A, 126B are provided with openings 128 whereby the lead frame can be mounted for precise movement through various work stations. Various apparatus for precisely indexing and performing various processes in connection with lead frames are well known in the semiconductor industry, and hence are not illustrated herein. If desired, the lead frame portions 120, 121 can be bent along the vertical dashed lines to achieve a profile like that illustrated in FIG. 2A.

During manufacture, chips (not shown) are typically solder-bonded to the header regions 120A, 121A of lead frame portions 120, 121. The unbonded upper surface of each chip can then be provided with a layer of solder. A conductive member such as the above-described dimpled link (not shown) can then be disposed on top of the chips, and the resulting assembly can be heated to solder-bond the link to the semiconductor chips. For example, the link can be heated to bring the solder on the chips up to an appropriate fusing temperature. As another example, the solder used on the chip upper surfaces can have a lower fusing temperature than the solder used on the chip lower surfaces. This will help prevent the heating for chip upper surface bonding from softening the previously made chip lower surface bonds.

Subsequent processes can be carried out in accordance with known technology used in the fabrication of devices using lead frames. For example, the resulting assembly can be disposed in a mold and a packaging material, for example, epoxy, can be forced into the mold under pressure. The material will flow around and completely encapsulates each chip and the header regions 120A, 120B of the first and second lead frame portions 120, 121. Upon hardening of the resin and opening of the mold, the device will comprise a solid resin envelope 140 having lead regions 120B, 121B extending therefrom, as well as connection members 124. The connection members 124 are then severed, for example, by a cutting or punching operation, to separate the encapsulated device from the remainder of the precursor lead frame. For instance, the connection members 124 can be cut along the horizontal dashed lines in FIG. B.

Although not illustrated, the precursor lead frame can be configured to include many pairs of first and second lead frame portions, with each pair ultimately being disposed in separate devices. This allows batch-processing techniques to be used as is known in the art. In this way, groups of identical packages structures can be simultaneously fabricated in accordance with the invention.

Although various embodiments are specifically illustrated and described herein, it will be appreciated that modifications and variations of the present invention are covered by the above teachings and are within the purview of the appended claims without departing from the spirit and intended scope of the invention.

The invention claimed is:

1. A surface-mountable device comprising:
   (a) a first chip comprising lower and upper electrical contacts;
   (b) a second chip comprising lower and upper electrical contacts;
   (c) an undivided first lead frame portion comprising a header region and a lead region, wherein the lower contact of the first chip is in electrical and mechanical connection with the header region of the first lead frame portion;
   (d) an undivided second lead frame portion comprising a header region and a lead region, wherein the lower contact of the second chip is in electrical and mechanical connection the header region of the second lead frame portion; and
   (e) packaging material encapsulating at least a portion of (i) each of the first and second chips, (ii) the header regions of the first and second lead frame portions, and (iii) the conductive member,
   wherein the lead regions of the first and second lead frame portions extend from said packaging material and are adapted to allow the device to be surface-mounted with another electrical component, and wherein the first and second chips are not stacked upon each other within the packaged device, and
   further comprising a third chip that comprises lower and upper electrical contacts, wherein the lower contact of the third chip is in electrical and mechanical connection with the header region of the second lead frame portion, and wherein the upper contact of the third chip is in electrical and mechanical connection with said conductive member or a separate conductive member, wherein a plurality of conductive members are disposed between and in electrical and mechanical connection with the upper electrical contact of the first chip, the upper electrical contact of the second chip, and the upper electrical contact of the third chip, such that the upper electrical contacts of the first, second and third chips are shorted together.

2. A surface-mountable device comprising:
   (a) a first chip comprising lower and upper electrical contacts;
   (b) a second chip comprising lower and upper electrical contacts;
   (c) an undivided first lead frame portion comprising a header region and a lead region, wherein the lower contact of the first chip is in electrical and mechanical connection with the header region of the first lead frame portion;
   (d) an undivided second lead frame portion comprising a header region and a lead region, wherein the lower contact of the second chip is in electrical and mechanical connection the header region of the second lead frame portion;
   (e) a conductive member disposed between and in electrical and mechanical connection with the upper electrical contact of the first chip and the upper electrical contact of the second chip; and
   (f) packaging material encapsulating at least a portion of (i) each of the first and second chips, (ii) the header regions of the first and second lead frame portions, and (iii) the conductive member,
   wherein the lead regions of the first and second lead frame portions extend from said packaging material and are adapted to allow the device to be surface-mounted with another electrical component, and wherein the first and second chips are not stacked upon each other within the packaged device, and
   further comprising a third chip that comprises lower and upper electrical contacts, wherein the lower contact of the third chip is in electrical and mechanical connection with the header region of the second lead frame portion, and wherein the upper contact of the third chip is in electrical and mechanical connection with said conductive member or a separate conductive member,
   wherein said first chip is in electrical and mechanical connection with the header region of the first lead frame portion, wherein said second and third chips are in electrical and mechanical connection with the header region of the second lead frame portion, and wherein the conductive member is in electrical and mechanical connection with each chip.

* * * * *

UNITED STATES PATENT AND TRADEMARK OFFICE
CERTIFICATE OF CORRECTION

| | |
|---|---|
| PATENT NO. | : 7,525,183 B2 |
| APPLICATION NO. | : 11/825991 |
| DATED | : April 28, 2009 |
| INVENTOR(S) | : Paddy O'Shea et al. |

It is certified that error appears in the above-identified patent and that said Letters Patent is hereby corrected as shown below:

On the title page item (57), Abstract, line 1, before "multi-chip", change "surface mountable" to --surface-mountable--.

On the title page item (57), Abstract, line 2, after "lead", change "frames" to --frame--.

Col. 1, line 17, before "devices", change "multichip" to --multi-chip--.

Col. 1, line 27, before "conductive", change "flames" to --frames--.

Col. 1, line 40, after "readily", change "surface mounted" to --surface-mounted--.

Col. 1, line 46, before "surface-mount", change "multichip" to --multi-chip--.

Col. 1, line 47, after "need", insert --to--.

Col. 3, line 36, after "multi-chip", change "devices" to --device--.

Col. 3, line 66, after "surface-mount", change "multichip" to --multi-chip--.

Col. 4, line 8, after "surface-mount", change "multichip" to --multi-chip--.

Col. 4, line 11, after "surface-mount", change "multichip" to --multi-chip--.

Col. 4, line 25, after "surface-mount", change "multichip" to --mult-chip--.

Col. 4, line 26, after "view", insert --of--.

Col. 5, line 28, after "power", change "handing" to --handling--.

Col. 7, line 1, after "are", change "surface mount" to --surface-mount--.

Col. 7, line 23, after "regions.", change "}" to --)--.

Col. 7, line 55, after "lower", change "that" to --than--.

UNITED STATES PATENT AND TRADEMARK OFFICE
CERTIFICATE OF CORRECTION

PATENT NO. : 7,525,183 B2
APPLICATION NO. : 11/825991
DATED : April 28, 2009
INVENTOR(S) : Paddy O'Shea et al.

It is certified that error appears in the above-identified patent and that said Letters Patent is hereby corrected as shown below:

Col. 8, line 8, after "Low-capacitance,", change "two-leaded" to --two-lead--.

Col. 8, line 10, before "packages", change "surface mount" to --surface-mount--.

Col. 8, line 13, after "either", delete --in--.

Col. 8, line 13, after "or", insert --a--.

Col. 8, line 33, after "each", change "another" to --other--.

Col. 8, line 63, after "completely", change "encapsulates" to --encapsulate--.

Col. 9, line 6, after "FIG.", change "B" to --8--.

Claim 2, Col. 10, line 21, after "connection", insert --with--.

Signed and Sealed this

Seventh Day of July, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,525,183 B2
APPLICATION NO. : 11/825991
DATED             : April 28, 2009
INVENTOR(S)       : Paddy O'Shea et al.

It is certified that error appears in the above-identified patent and that said Letters Patent is hereby corrected as shown below:

On the title page item (57), Abstract, line 1, before "multi-chip", change "surface mountable" to --surface-mountable--.

On the title page item (57), Abstract, line 2, after "lead", change "frames" to --frame--.

Col. 1, line 17, before "devices", change "multichip" to --multi-chip--.

Col. 1, line 27, before "conductive", change "flames" to --frames--.

Col. 1, line 40, after "readily", change "surface mounted" to --surface-mounted--.

Col. 1, line 46, before "surface-mount", change "multichip" to --multi-chip--.

Col. 1, line 47, after "need", insert --to--.

Col. 3, line 36, after "multi-chip", change "devices" to --device--.

Col. 3, line 66, after "surface-mount", change "multichip" to --multi-chip--.

Col. 4, line 8, after "surface-mount", change "multichip" to --multi-chip--.

Col. 4, line 11, after "surface-mount", change "multichip" to --multi-chip--.

Col. 4, line 25, after "surface-mount", change "multichip" to --multi-chip--.

Col. 4, line 26, after "view", insert --of--.

Col. 5, line 28, after "power", change "handing" to --handling--.

Col. 7, line 1, after "are", change "surface mount" to --surface-mount--.

Col. 7, line 23, after "regions.", change "}" to --)--.

Col. 7, line 55, after "lower", change "that" to --than--.

Col. 8, line 8, after "Low-capacitance,", change "two-leaded" to --two-lead--.

CERTIFICATE OF CORRECTION (continued)
U.S. Pat. No. 7,525,183 B2

Col. 8, line 10, before "packages", change "surface mount" to --surface-mount--.

Col. 8, line 13, after "either", delete --in--.

Col. 8, line 13, after "or", insert --a--.

Col. 8, line 33, after "each", change "another" to --other--.

Col. 8, line 63, after "completely", change "encapsulates" to --encapsulate--.

Col. 9, line 6, after "FIG.", change "B" to --8--.

Claim 2, Col. 10, line 21, after "connection", insert --with--.

This certificate supersedes the Certificate of Correction issued July 7, 2009.

Signed and Sealed this

Thirteenth Day of April, 2010

David J. Kappos
*Director of the United States Patent and Trademark Office*